United States Patent
Shimooka (10) Patent No.: US 9,859,465 B2
(45) Date of Patent: *Jan. 2, 2018

(54) NITRIDE SEMICONDUCTOR ELEMENT AND METHOD FOR MANUFACTURING THE SAME

(71) Applicant: NICHIA CORPORATION, Anan-shi, Tokushima (JP)

(72) Inventor: Tomohiro Shimooka, Tokushima (JP)

(73) Assignee: NICHIA CORPORATION, Anan-Shi (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/349,584

(22) Filed: Nov. 11, 2016

(65) Prior Publication Data
US 2017/0062658 A1 Mar. 2, 2017

Related U.S. Application Data

(63) Continuation of application No. 14/694,792, filed on Apr. 23, 2015, now Pat. No. 9,525,105.

(30) Foreign Application Priority Data

Apr. 25, 2014 (JP) .................. 2014-091993

(51) Int. Cl.
*H01L 33/22* (2010.01)
*H01L 21/302* (2006.01)
(Continued)

(52) U.S. Cl.
CPC .......... *H01L 33/22* (2013.01); *H01L 21/0242* (2013.01); *H01L 21/0243* (2013.01);
(Continued)

(58) Field of Classification Search
CPC ....................................................... H01L 33/22
See application file for complete search history.

(56) References Cited

U.S. PATENT DOCUMENTS 6,657,236 B1 * 12/2003 Thibeault ............... H01L 33/20
257/81
6,870,191 B2 * 3/2005 Niki ...................... H01L 33/007
257/113

(Continued)

FOREIGN PATENT DOCUMENTS

JP 2005-101566 A 4/2005
JP 2011-176379 A 9/2011
(Continued)

OTHER PUBLICATIONS

Non-Final Office Action issued in U.S. Appl. No. 14/694,792 dated Mar. 25, 2016.

(Continued)

*Primary Examiner* — Earl Taylor
(74) *Attorney, Agent, or Firm* — Foley & Lardner LLP (57) ABSTRACT

A method of manufacturing a nitride semiconductor element includes dry etching a main surface of a sapphire substrate at a c-plane side thereof, using a mask provided on the main surface, to form a plurality of projections, each having a circular bottom surface; wet etching the sapphire substrate to form an upper part of each projection into a triangular pyramid shape while maintaining the circular bottom surface of the projection; and growing a semiconductor layer made of a nitride semiconductor on a dry etched surface and a wet etched surface of the sapphire substrate.

14 Claims, 7 Drawing Sheets

(51) Int. Cl.
*H01L 33/00* (2010.01)
*H01L 33/32* (2010.01)
*H01L 21/02* (2006.01)
*H01L 33/12* (2010.01)

(52) U.S. Cl.
CPC .... *H01L 21/0254* (2013.01); *H01L 21/02458* (2013.01); *H01L 21/02658* (2013.01); *H01L 33/007* (2013.01); *H01L 33/12* (2013.01); *H01L 33/32* (2013.01)

(56) References Cited

U.S. PATENT DOCUMENTS

| | | | | |
|---|---|---|---|---|
| 7,683,386 B2* | 3/2010 | Tanaka | H01L 21/0237 | 257/88 |
| 7,781,790 B2* | 8/2010 | Minato | H01L 33/10 | 257/88 |
| 8,236,591 B2* | 8/2012 | Ichihara | B82Y 20/00 | 219/121.6 |
| 8,558,448 B2* | 10/2013 | Harada | H01L 33/504 | 313/498 |
| 8,564,006 B2* | 10/2013 | Tachibana | H01L 29/045 | 257/100 |
| 8,779,463 B2* | 7/2014 | Narita | C30B 25/183 | 257/103 |
| 8,927,348 B2* | 1/2015 | Sugano | H01L 33/0095 | 257/E21.006 |
| 9,142,712 B2* | 9/2015 | Tamemoto | H01L 33/007 | |
| 9,209,351 B1* | 12/2015 | Tamemoto | H01L 33/007 | |
| 9,257,604 B2* | 2/2016 | Ou | H01L 33/22 | |
| 2001/0050376 A1* | 12/2001 | Shibata | H01L 31/03042 | 257/190 |
| 2003/0057444 A1* | 3/2003 | Niki | H01L 33/007 | 257/200 |
| 2005/0179130 A1* | 8/2005 | Tanaka | H01L 21/0237 | 257/730 |
| 2008/0303042 A1* | 12/2008 | Minato | H01L 33/10 | 257/98 |
| 2009/0114933 A1* | 5/2009 | Osawa | H01L 33/22 | 257/96 |
| 2010/0123148 A1* | 5/2010 | Park | H01L 33/20 | 257/94 |
| 2010/0187542 A1* | 7/2010 | Ichihara | B82Y 20/00 | 257/76 |
| 2010/0255621 A1* | 10/2010 | Minato | H01L 33/10 | 438/41 |
| 2011/0062479 A1* | 3/2011 | Sugano | H01L 33/0095 | 257/98 |
| 2011/0210425 A1* | 9/2011 | Su | C30B 23/025 | 257/615 |
| 2011/0316041 A1* | 12/2011 | Narita | C30B 25/183 | 257/103 |
| 2012/0033402 A1* | 2/2012 | Harada | H01L 33/504 | 362/84 |
| 2012/0228656 A1* | 9/2012 | Kamiyama | H01L 33/22 | 257/98 |
| 2012/0292630 A1 | 11/2012 | Wu et al. | | |
| 2013/0146892 A1* | 6/2013 | Minato | H01L 33/10 | 257/76 |
| 2014/0070253 A1* | 3/2014 | Kawase | H01L 33/465 | 257/98 |
| 2014/0124805 A1* | 5/2014 | Minato | H01L 33/10 | 257/95 |
| 2014/0239337 A1* | 8/2014 | Huang | H01L 33/20 | 257/99 |
| 2014/0239338 A1* | 8/2014 | Huang | H01L 33/20 | 257/99 |
| 2014/0239339 A1* | 8/2014 | Huang | H01L 33/20 | 257/99 |
| 2015/0076505 A1* | 3/2015 | Ke | H01L 33/22 | 257/76 |
| 2015/0155431 A1* | 6/2015 | Tamemoto | H01L 33/007 | 438/29 |
| 2015/0311388 A1* | 10/2015 | Shimooka | H01L 33/007 | 257/615 |

FOREIGN PATENT DOCUMENTS

JP 2012-244138 A 12/2012
WO WO-2009/020033 A1 2/2009
WO WO-2012/002240 A1 1/2012

OTHER PUBLICATIONS

Notice of Allowance issued in U.S. Appl. No. 14/694,792 dated Aug. 12, 2016.
Yang (2013), "Improving the quality of GaN epilayer by preparing a novel patterned sapphire substrate", Journal of Materials Science: Materials in Electronics, published online on Nov. 7, 2013, vol. 25, No. 1, pp. 267-272.

* cited by examiner

NITRIDE SEMICONDUCTOR ELEMENT AND METHOD FOR MANUFACTURING THE SAME

CROSS-REFERENCE TO RELATED APPLICATIONS

The present application is a continuation of U.S. patent application Ser. No. 14/694,792, filed on Apr. 23, 2015, which is based on and claims priority to Japanese Patent Application No. 2014-091993, filed on Apr. 25, 2014, the entire contents of which are hereby incorporated by reference.

BACKGROUND OF THE INVENTION

Field of the Invention

The present disclosure relates to a nitride semiconductor element formed by crystal growth from a substrate, and a method for manufacturing the same.

Description of the Related Art

Alight emitting diode (LED) made of a nitride semiconductor is normally formed by sequentially stacking an n-type semiconductor layer, an active layer, and a p-type semiconductor layer on a sapphire substrate. Conventionally, there is proposed a means for forming projections on the sapphire substrate in order to improve the light extraction efficiency. In order to suppress deterioration of crystallinity and the occurrence of voids during the crystal growth of a nitride semiconductor on the sapphire substrate with the projections formed thereon, the technique is proposed which involves forming an inclined surface of the projection as a crystal growth suppression surface to promote the growth of the nitride semiconductor in the lateral direction (see WO 2012/002240 A).

It is desirable that the shape of the bottom surface of the projection has a shape close to a regular hexagonal shape from the view point of good growth of the nitride semiconductor having a hexagonal crystal. However, in the technique proposed in WO 2012/002240 A, the bottom surface of the projection is formed in a substantially triangle shape, which does not sufficiently correspond to the growth of the nitride semiconductor, making it difficult for the nitride semiconductor to be grown in some cases. For this reason, the technique proposed in WO 2012/002240 A is desired to further improve an etching method and the shape of the projection.

In a growth process of a GaN-based nitride semiconductor on a sapphire substrate, when crystals of the nitride semiconductor are grown, a buffer layer made of AlGaN and the like is inserted between the sapphire substrate and the nitride semiconductor for the purpose of the relaxation of a lattice mismatch between the sapphire substrate and the nitride semiconductor. When a sapphire substrate with projections formed thereon is used, the nitride semiconductor might be grown from a certain portion of the projection (abnormal growth) in some cases.

The nitride semiconductor is grown from the c-plane of the sapphire substrate ([0001] plane, or an upper surface of the sapphire substrate) not only in the vertical direction, but also in the lateral direction so as to cover the projections. The abnormal growth of the nitride semiconductor from the certain portion of the projection can adversely affect the growth in the lateral direction of the nitride semiconductor. As a result, the obtained nitride semiconductor might have a deteriorated crystallinity.

SUMMARY OF THE INVENTION

Embodiments of the present invention have been made in view of the foregoing points, and it is an object of certain embodiments of the present invention to provide a nitride semiconductor element including a nitride semiconductor with good crystallinity and a method for manufacturing the same, which promotes an appropriate growth of a nitride semiconductor in a vertical direction, as well as suppresses the crystal growth of a GaN-based nitride semiconductor from a certain portion of a projection on a sapphire substrate in order to promote the appropriate growth of the nitride semiconductor in the lateral direction.

In view of the foregoing problems, a method for manufacturing a nitride semiconductor element according to a first aspect of the present invention includes: dry etching a main surface of a sapphire substrate at a c-plane side thereof using a mask provided on the main surface to form a plurality of projections, each having a circular bottom surface; wet etching the sapphire substrate to form an upper part of the projection into a triangular pyramid shape with the bottom surface of the projection kept circular; and growing a semiconductor layer made of a nitride semiconductor on a dry etched surface and a wet etched surface of the sapphire substrate.

Alternatively, in view of the foregoing problems, a method for manufacturing a nitride semiconductor element according to a second aspect of the present invention includes: preparing a sapphire substrate with a plurality of projections formed on a surface of sapphire substrate at a c-plane side thereof, each of the projections having a circular bottom surface and an upper part in a triangular pyramid shape, ridge lines of the triangular pyramid extending in a direction of an m-axis in a top view; and growing a semiconductor layer made of a nitride semiconductor on the surface of the sapphire substrate.

In view of the foregoing problems, a nitride semiconductor element according to a third aspect of the present invention includes: a sapphire substrate with a plurality of projections provided on a surface thereof at a c-plane side; and a semiconductor layer made of a nitride semiconductor and provided on the surface of the sapphire substrate, wherein each projection has a circular bottom surface, and an upper part in a triangular pyramid shape, and each ridge line of the triangular pyramid shape extends in an m-axis direction in a top view.

According to the manufacturing method of the nitride semiconductor element in the first and second aspects of the present invention, the bottom surface of the projection on the sapphire substrate is circular, which can easily grow the nitride semiconductor having the hexagonal crystal, as compared to a projection with a triangular bottom surface. Furthermore, because the upper part of the projection is formed in the triangular pyramid shape by the methods mentioned above, the inclined surfaces composing the triangular pyramid shape serve as a crystal growth suppression surface that can easily suppress the crystal growth of the nitride semiconductor, thereby suppressing the crystal growth of the nitride semiconductor from the projection. The nitride semiconductor element according to the third aspect of the present invention includes a nitride semiconductor with good crystallinity, thereby improving the light emission efficiency of the nitride semiconductor element.

BRIEF DESCRIPTION OF THE DRAWINGS

FIGS. 2A and 2B are schematic illustrations showing plane directions of a sapphire crystal in a sapphire substrate.

FIGS. 3A, 3B, and 3C are schematic illustrations showing projections formed on the sapphire substrate for the nitride semiconductor element according to the embodiment of the present invention.

FIGS. 4A to 4H are schematic illustrations explaining a manufacturing method of the substrate for the nitride semiconductor element according to the embodiment of the present invention.

FIGS. 5A, 5B, 5C, and 5D are schematic illustrations explaining a manufacturing method of the nitride semiconductor element according to the one embodiment of the present invention.

FIGS. 6A and 6B are illustrations for explaining effects of the projections formed on the sapphire substrate for the nitride semiconductor element according to the embodiment of the present invention.

FIGS. 7A and 7B are illustrations for explaining the effects of the projections formed in the sapphire substrate for the nitride semiconductor element according to the embodiment of the present invention.

DETAILED DESCRIPTION OF THE EMBODIMENT

A nitride semiconductor element and a method for manufacturing the same according to one embodiment of the present invention will be described below with reference to the accompanying drawings. The drawings referred to in the description below schematically illustrate the concept of the present invention. In some drawings, the scale, distance, positional relationship and the like of respective members are exaggerated, or the illustration of a part of a member is omitted. In the description below, the same reference names and numerals denote the same or similar members in principle, and a detailed description thereof will be omitted as appropriate.

[Structure of Nitride Semiconductor Element]

Figure 1:
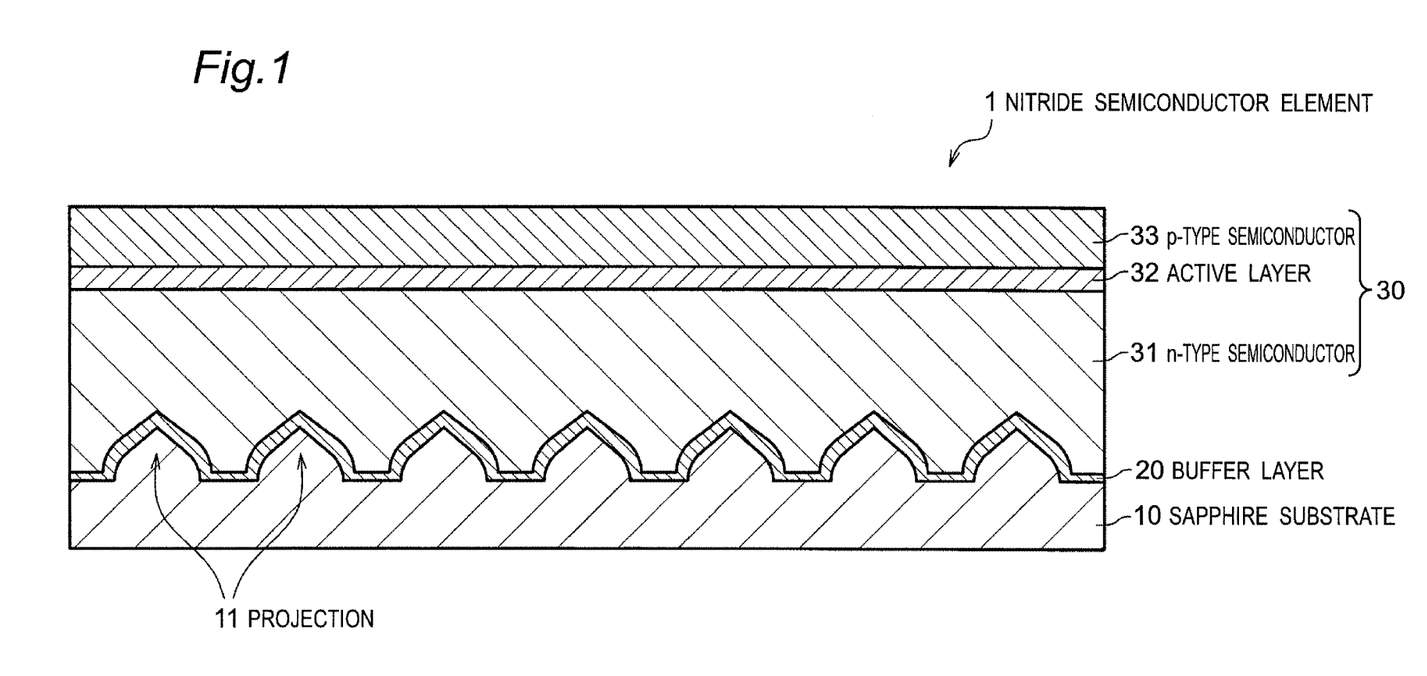
FIG. 1 is a schematic cross-sectional view showing an entire structure of a nitride semiconductor element according to one embodiment of the present invention.

The structure of the nitride semiconductor element according to one embodiment of the present invention will be described below with reference to FIGS. 1 to 3. As shown in FIG. 1, the nitride semiconductor element 1 is, for example, a LED, and has a laminated structure including a sapphire substrate 10 as a substrate for the nitride semiconductor element, a buffer layer 20, and a semiconductor layer 30, which are stacked on each other.

The sapphire substrate (the substrate for the nitride semiconductor element) 10 supports the semiconductor layer 30 and is also to grow a nitride semiconductor (e.g., GaN) thereon. As illustrated in FIG. 1, the sapphire substrate 10 is formed in a flat plate shape, and has a plurality of projections 11 on its upper surface. The sapphire substrate 10 including the projections 11 has a thickness of, for example, 50 µm to 200 µm as a whole.

The projection 11 is to improve the light extraction efficiency of the nitride semiconductor element 1, and also to suppress the occurrence of voids and deterioration of the crystallinity when growing crystals of the nitride semiconductor on the sapphire substrate 10. Here, as shown in FIG. 2A, the sapphire substrate 10 is formed of a sapphire crystal SC having a predetermined sapphire crystal structure, and a main surface of the sapphire substrate 10 consists of a c-plane of the sapphire crystal. Note that the term "c-plane" as used in the present specification may include a surface slightly inclined at an inclination angle to the c-plane. The inclination angle is, for example, approximately 3° or less. The projection 11 is formed on the surface at the c-plane side of the substrate as the main surface. The c-plane exposed between the projections 11 (that is, a part of the main surface without having the projection 11) is a crystal growth surface 10a (see FIGS. 3A and 3C).

Figure 2A:
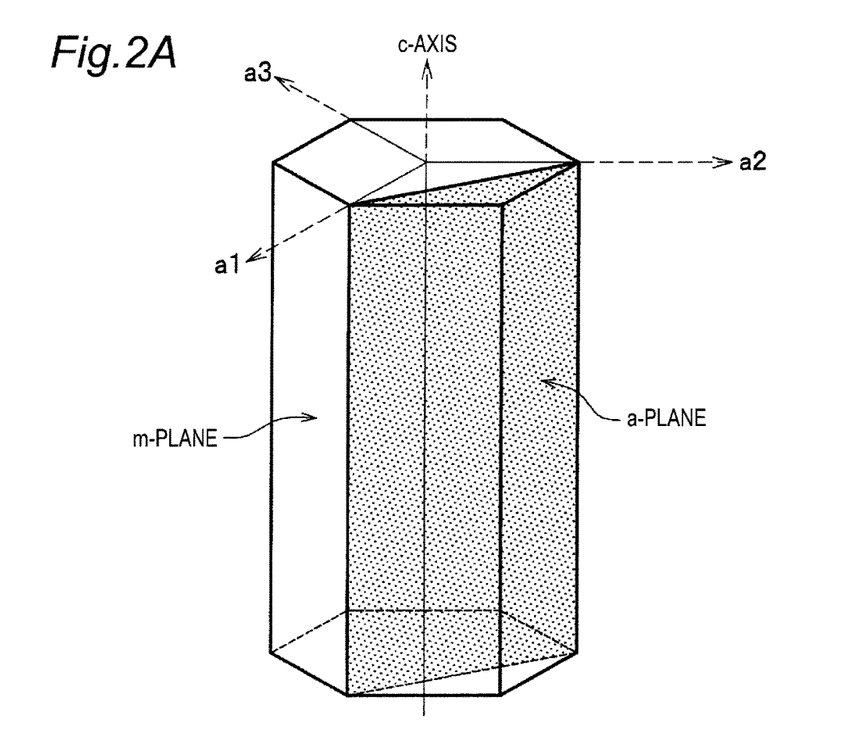
FIG. 2A is an illustration a unit cell.
Figure 2B:
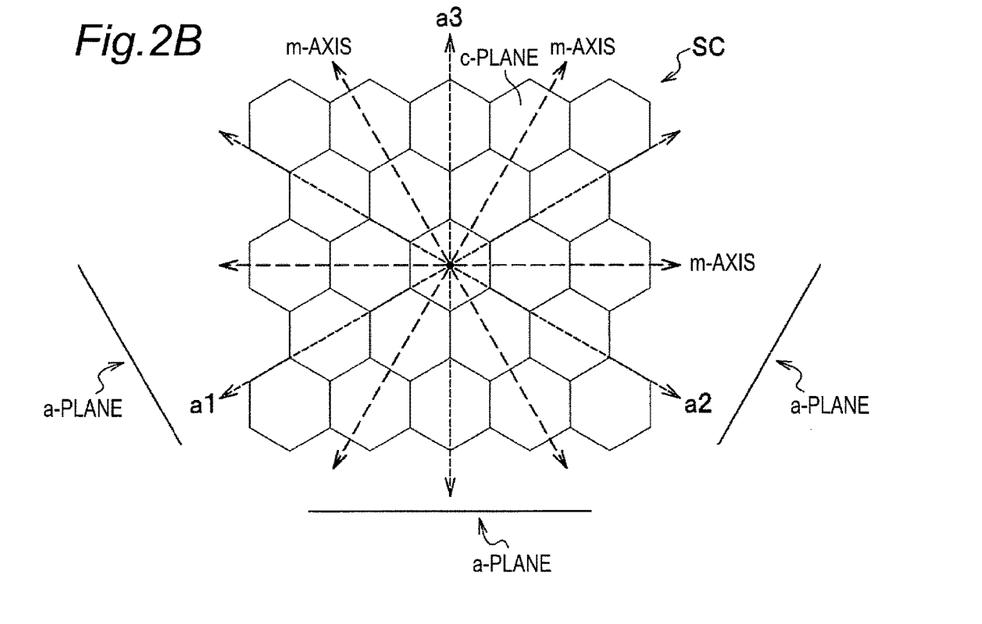
FIG. 2B shows a plan view of a sapphire crystal structure.

As shown in FIGS. 2A and 2B, the sapphire crystal SC has, in addition to the c-plane, six m-planes which are side surfaces of a hexagonal column as shown in an illustration of a unit cell, and three a-planes respectively perpendicular to an $a_1$-axis, an $a_2$-axis, and an $a_3$-axis. The direction perpendicular to the m-plane is an m-axis direction. The m-axis direction includes three directions each of which extends in direction at 30 degrees to the direction of each of the $a_1$-axis, $a_2$-axis, and $a_3$-axis.

Figure 3A:
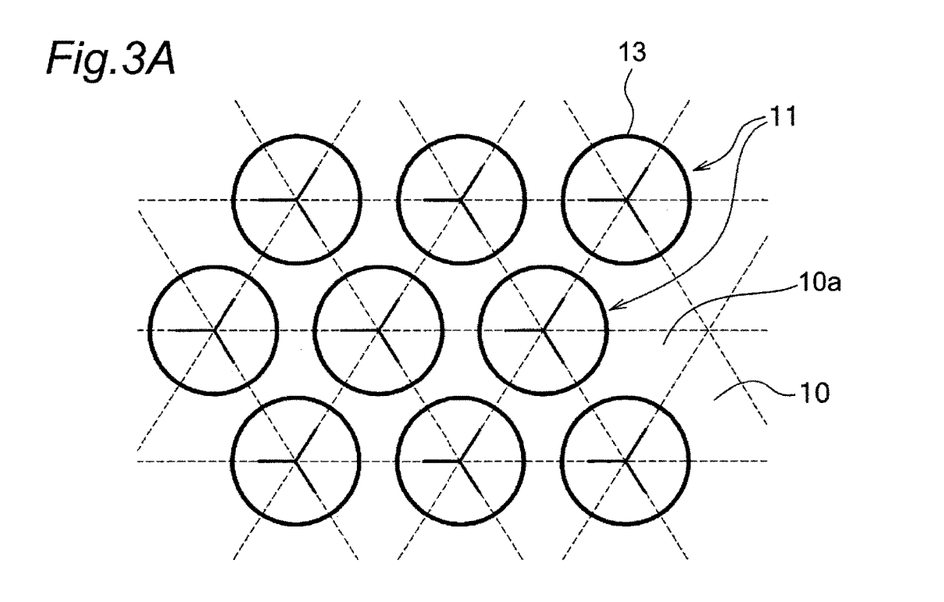
FIG. 3A is a plan view showing arrangement of the projections.

A plurality of the projections 11 with the same shape are arranged as shown in FIGS. 1 and 3A. As shown in the planar view of FIG. 3A, the projections 11 are arranged in a regular manner such that distances between the centers of the adjacent projections 11 are substantially the same. For example, as shown in FIG. 3A, the projections 11 are disposed such that the centers of the projections are positioned at vertexes (or lattice points) of a triangular lattice. Note that the arrangement of the projections 11 shown in FIG. 3A is one example, and alternatively, the projections 11 may be positioned at lattice points of other polygonal lattices, such as a quadrangular lattice, a hexagonal lattice and the like.

A distance between adjacent projections 11 is preferably in a range of, for example, 0.2 µm to 5 µm. The width and height of the projection 11 are preferably in a range of, for example, 0.2 µm to 5 µm, and 0.2 µm to 2 µm, respectively. The number of the projections 11 is determined according to the area of the sapphire substrate 10, taking into consideration the width of each projection 11 and the distance between the adjacent projections 11. For example, the projections 11 are equally positioned across the entire surface of the sapphire substrate 10.

Figure 3B:
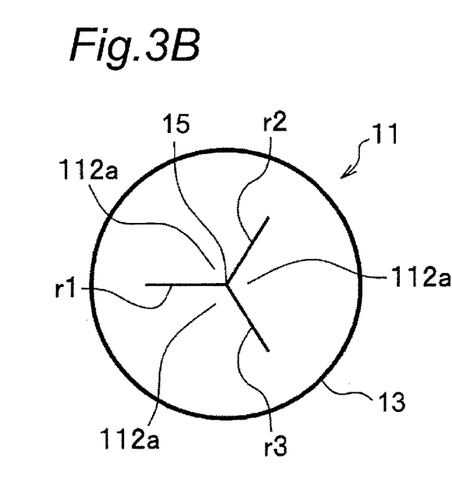
FIG. 3B is a plan view showing the structure of the projection.
Figure 3C:
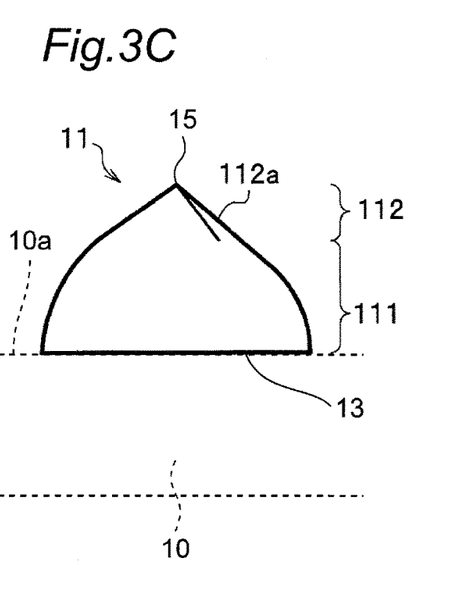
FIG. 3C is a side view showing the structure of the projection.

As shown in FIGS. 3B and 3C, the projection 11 has a bottom surface 13 having a circular shape, and an upper part of a triangular pyramid shape with three ridge lines r1, r2, and r3 extending from a vertex of the triangular pyramid. Each of the ridge lines r1, r2 and r3 extends, for example, in the direction of each of the m-axes (see FIG. 2B) in a top view. Specifically, referring to FIGS. 3B and 3C, the projection 11 includes a lower part (hereinafter referred to as a "lower projecting portion") 111 of the projection 11 positioned at the side of the crystal growth surface 10a of the sapphire substrate 10, and the upper part (hereinafter referred to as an "upper projecting portion") 112 of the projection 11 formed on the lower projecting portion 111.

It is necessary to shape the bottom surface 13 of the lower projecting portion 111 into a circular shape. The lower projecting portion 111 can be formed in, for example, a truncated cone shape or a cylindrical shape, in addition to the dome shape as shown in FIGS. 3B and 3C. In all of these shapes, the side surface of the lower projecting portion 111 becomes a curved surface. That is, the lower projecting portion 111 means a curved part of the projection 11. The lower projecting portion 111 can be formed by dry etching the sapphire substrate 10 under predetermined conditions in the first etching step included in the manufacturing method of the substrate for the nitride semiconductor element, which will be mentioned below.

The lower projecting portion 111 is preferably formed in a conical shape or dome shape, rather than the cylindrical shape. The nitride semiconductor grows from the c-place serving as the crystal growth surface of the sapphire substrate. However, it is known that the nitride semiconductor may be slightly grown from an a-plane perpendicular to the c-plane of the sapphire substrate. When the lower projecting portion 111 has the cylindrical shape extending in the direction perpendicular to the c-plane, the side surface of the cylindrical shape is perpendicular to the c-plane, and tangential planes of the side surface includes six tangential planes that correspond to the a-plane. Thus, the nitride semiconductor can be grown from the side surface of the cylindrical shape. On the other hand, when the lower projecting portion 111 has the conical shape or dome shape, tangential planes of the side surface of the lower projecting portion 111 is not perpendicular to the c-plane. Thus, the crystal growth of the nitride semiconductor from the side surface of the lower projecting portion 111 can be effectively suppressed.

Here, the nitride semiconductor has a hexagonal crystal. When the bottom surface 13 of the lower projecting portion 111 is circular as mentioned above, the following advantages are obtained.

When a nitride semiconductor is grown using a sapphire substrate with projections on a c-plane and the projection has a surface serving as a crystal growth suppression surface (for example, projections disclosed in WO 2012/002240 A), crystals of the nitride semiconductor are firstly grown mainly in the vertical direction from a part of the c-plane (a crystal growth surface) that does not have any projection and are also grown so as to cover the projections. Thus, the nitride semiconductor grown vertically has a hole shaped due to the shape of the bottom surface of the projecting portion. Thereafter, the nitride semiconductor grows in the lateral direction to fill the hole therewith. In this way, a plurality of the projections on the sapphire substrate generates a plurality of holes. If the holes have different dimensions and shapes, the crystal growth of the nitride semiconductor for filling the holes will vary among the holes. As a result, the crystallinity of the nitride semiconductor might deteriorate.

Because the nitride semiconductor has the hexagonal crystal, holes having regular hexagonal cylinder shapes or regular hexagonal pyramid shapes are more likely to be generated. When the bottom surface of the projection provided on the sapphire substrate is formed in the regular hexagonal shape, holes having the regular hexagonal cylinder shape or regular hexagonal pyramid shape reflecting the dimension and shape of the bottom surface of the projection can be easily formed. By forming the projections having the bottom faces with equal-dimensioned regular hexagonal shapes, the dimensions and shapes of the holes can be set equal to each other. Thus, when the nitride semiconductor grows in the lateral direction, there hardly occurs a difference in the rates for filling the holes and the conditions of the filled holes, which can form the nitride semiconductors of relatively high crystallinity. In the case of the hole having the regular hexagonal cylinder shape or regular hexagonal pyramid shape, six inner side surfaces of the hole are consisted of the same crystal plane of the nitride semiconductors. As a result, the crystals are grown from the respective inner side surfaces at the same crystal growth rate when the nitride semiconductor grows in the lateral direction, which can improve the crystallinity of the nitride semiconductor.

For this reason, the regular hexagonal bottom surface of the projection on the sapphire substrate is considered to enable production of the nitride semiconductor of high crystallinity. However, it is difficult to form the projection with the regular hexagonal bottom surface by the etching technique for use in formation of projections on a sapphire substrate. Here, even though the shape of the bottom surface of the projection is not completely regular hexagonal, as long as the shape of the bottom surface is close to the regular hexagonal shape, and especially a circular shape, holes with a regular hexagonal cylinder shape or a regular hexagonal pyramid shape tend to be generated in the nitride semiconductor. As shown in FIG. 3B, the projection 11 with the circular bottom surface 13 can be relatively easily formed by dry etching using a circular mask. In this way, when the sapphire substrate with the projections 11 having the circular bottom surface 13 is used to form the nitride semiconductor, holes having a substantially regular hexagonal cylinder shape or substantially hexagonal pyramid shape are generated in the vertical growth of the nitride semiconductor. Therefore, a nitride semiconductor with relatively good homogeneity is obtained. That is, the projection 11 having the bottom surface 13 with the circular shape is easy to form, and can provide the nitride semiconductor of the relatively high crystallinity. In this way, both conditions for the manufacture and for the crystal growth can be easily satisfied.

The term "circular shape" regarding the shape of the bottom surface 13 of the projection 11 as used in the embodiments of the present invention does not necessarily mean an exact circle. For example, even if the shape of the bottom surface 13 is an ellipse having a ratio of the length of its major axis to that of its minor axis of 1.0 to 1.3, the hole having the substantially regular hexagonal cylinder shape or regular hexagonal pyramid shape can be provided when the nitride semiconductor is grown in the vertical direction. Even if the bottom surface 13 has a shape that is formed by cutting a part of a circle with a chord, as long as the ratio of the length of the arc to the entire length of the circle is 0.7 or more, a hole having a substantially regular hexagonal cylinder shape or a substantially hexagonal pyramid shape can be provided in the same way.

The sapphire substrate 10 can be processed by dry-etching using a mask. When the mask has a circular shape, and is formed of the material that is able to be etched by dry etching, a dome-shaped projection can be formed. When the projection has the dome shape, an angle formed by the c-plane and a tangential plane on the surface of a top part of the projection becomes small. On the other hand, when the mask has a circular shape, and is formed of the material that is not able to be etched by dry etching, a cylindrical projection can be formed. The cylindrical projection has an upper surface corresponding to the c-plane. Therefore, the dome shaped projection as well as the cylindrical projection can cause the growth of the nitride semiconductor from the top part of the dome-shaped projection and the upper surface of the cylindrical projection. For this reason, in the embodiment of the present invention, the upper projecting portion 112 of the projection 11 is formed into the triangular pyramid shape by wet etching while keeping the lower projecting portion 11 circular. Thus, the surface of the top part of the dome-shaped projection, as well as the upper surface of the cylindrical projection are replaced by the inclined surfaces 112*a* forming the triangular pyramid shape with ridge lines extending from the tip 15 in m-axis directions. Such the inclined surface 112*a* is a surface from which the nitride semiconductor is hardly grown (that is, the crystal growth suppression surface), which can suppress the crystal growth from the upper projecting portion 112. The inclined surfaces 112*a* can be formed easier at the top part of the dome-shaped projection rather than at the upper surface of the cylindrical projection.

As shown in FIGS. 3B and 3C, the upper projecting portion 112 is formed into the triangular pyramid shape from the tip 15 of the projection 11 to a predetermined position. The upper projecting portion 112 is formed continuously from the lower projecting portion 111. In FIGS. 3B and 3C, the upper projecting portion 112 corresponds to a part of the projection 11 in the form of the triangular pyramid shape defined by the ridge lines r1, r2 and r3. The upper projecting portion 112 can be formed by wet etching the sapphire substrate 10 under predetermined conditions in a second etching step of the manufacturing method of the substrate for the nitride semiconductor element, as will be described below.

The projection of the sapphire substrate disclosed in WO 2012/002240 A has an upper projecting portion including inclined surfaces and ridge lines. A position of a lower end of the inclined surface coincides with a position of a lower end of ridge line. On the other hand, in the embodiment of the present invention, as shown in FIG. 3C, the inclined surfaces 112*a* of the upper projecting portion 112 extend below a lower end of the ridge lines r1, r2 and r3. The inclined surfaces 112*a* is larger than the inclined surface of the projection having the lower end at the same position as the lower end of the ridge line (disclosed in WO 2012/002240 A). As a result, the larger inclined surface can suppress the abnormal growth of the nitride semiconductor.

As shown in FIGS. 3B and 3C, the upper projecting portion 112 has inclined surfaces 112*a* extending in three directions. Typically, the inclined surface 112*a* is similar to a surface corresponding to an R-plane of the sapphire crystal SC (with a Miller index of 10-14) (see FIG. 2). An angle of the inclined surface 112*a* with respect to the bottom surface 13 (c-plane) of the projection 11 is, for example, approximately 33° to 37°.

The range (height) of the upper projecting portion 112 is preferably 10% or more of the overall height of the projection 11, and more preferably 20% or more thereof. The range of the upper projecting portion 112 may be 50% or more of the overall height of the projection 11. The range of the upper projecting portion 112 is preferably 80% or less of the overall height of the projection 11. In this way, the circular shape of the bottom surface 13 of the projection 11 can be sufficiently maintained, which can enhance the effect of controlling the shape of the hole into the substantially regular hexagonal cylinder shape or regular hexagonal pyramid shape when the nitride semiconductor grows in the vertical direction. The area of the inclined surfaces 112*a* of the upper projecting portion 112 in the projection 11 can be sufficiently ensured to effectively suppress the crystal growth of the nitride semiconductor from the projection 11.

When the projections 11 with the above-mentioned structure are formed on the surface at the c-plane side of the sapphire substrate 10, crystals of the nitride semiconductor are grown mainly from a flat surface with no projections 11 (the crystal growth surface 10*a*). The nitride semiconductor is hardly grown from the surface of the projection 11, whereby the nitride semiconductor grown from the crystal growth surface 10*a* is grown not only in the upward direction, but also in the lateral direction. The hole in the nitride semiconductor formed at an upper area of the projection 11 is filled with the nitride semiconductor grown from an inner surface of the hole toward a center of the hole to become a flat grown layer without the hole. That is, the nitride semiconductor grown from the inner surface of the hole is joined to itself above the projection 11. In general, when a nitride semiconductor is grown on a sapphire substrate without a projection, the obtained nitride semiconductor layer includes many dislocations extending therethrough from the surface of the sapphire substrate to the surface of the nitride semiconductor layer. On the other hand, when the nitride semiconductor is grown on the sapphire substrate 10 with the projection 11, the direction of the dislocation can be changed so as to expose the dislocation at the surface of the obtained nitride semiconductor layer. As a result, the dislocations exposed at the surface of the nitride semiconductor layer can be reduced, and a semiconductor with high crystallinity can be obtained. Now, a detailed description will be given of the relationship between a crystal growth mechanism of the nitride semiconductor and the projection 11 on the sapphire substrate 10.

When crystals of the nitride semiconductor (e.g., GaN) are grown on the sapphire substrate 10, the nitride semiconductor crystals are grown on, for example, the crystal growth surface (the c-plane of the sapphire) from which the nitride semiconductor crystals can be grown. However, since the GaN crystal is not lattice-matched to the sapphire crystal of the sapphire substrate 10 (that is, there is a difference in lattice constant between the sapphire crystal of the sapphire substrate 10 and the crystal of the nitride semiconductor), a number of dislocations are generated in the formed crystals due to lattice mismatch. On the other hand, as shown in FIGS. 3B and 3C, the above-mentioned projection 11 has the inclined surface 112*a* that is not parallel to the upper surface (c-plane) of the sapphire substrate 10.

Here, the c-plane of the sapphire substrate 10 serves as a "crystal growth surface" that enables the crystal growth of the nitride semiconductor; and the inclined surface 112a of the upper projecting portion 112 of the projection 11 has a plane orientation different from that of the crystal growth surface, and thus serves as a "crystal growth suppression surface". That is, the crystal growth from the inclined surface 112a is suppressed. As explained below with reference to FIGS. 7A and 7B, some nitride semiconductor 30a tends to be grown from a certain part of the surface of the projection 11. The certain part of the surface is an area extending from a center of the projection 11 toward the m-axis direction. The ridge lines r1 to r3 connecting the adjacent inclined surfaces 112a (the adjacent crystal growth suppression surfaces) can be formed at the certain part of the surface by wet etching, thereby suppressing the crystal growth on the inclined surfaces 112a. When the projection 11 is formed on the c-plane of the sapphire substrate 10, the crystal growth suppression surface exists in the crystal growth surface, whereby the nitride semiconductor crystal is grown in three-dimensional growth during the crystal growth.

Dislocations are generated in the nitride semiconductor due to a difference in lattice constant between the crystal of the nitride semiconductor and the sapphire crystal of the sapphire substrate 10. Thus, a number of dislocations are included in the nitride semiconductor vertically grown from the growth surface 10a of the sapphire substrate 10, or from the buffer layer 20 covering the growth surface 10a. However, when the nitride semiconductor is grown in the lateral direction to cover the crystal growth suppression surface (the inclined surface 112a), new dislocations hardly occur. The crystal growth of the nitride semiconductor from the inclined surface 112a is so slight that the inclined surface 112a is kept covered with the buffer layer. Thus, when crystals of the nitride semiconductor are grown in the lateral direction from the inner surface of the hole formed at an upper area of the projection 11 toward the center of the hole so as to be joined to itself above the projection 11 to fill the hole with the grown nitride semiconductor, the crystals are grown along the surface of the projection 11. As a result, the occurrence of a new dislocation from the surface of the projection 11 can be prevented, and the dislocations extending from the growth surface 10a in the growth direction of the nitride semiconductor can converge above the projection 11, which can reduce the dislocations appearing on the surface of the nitride semiconductor. Thus, the dislocation density of the semiconductor layer 30 is reduced to thereby improve the crystallinity, so that the nitride semiconductor element can improve its light emission efficiency.

The projection 11 on the sapphire substrate 10 has not only the effect of improving the crystallinity as mentioned above, but also an effect of improving the light extraction efficiency of the nitride semiconductor element 1 because the projection 11 reflects the light propagating within the nitride semiconductor element 1 in the lateral direction to cause the reflected light to propagate in the longitudinal direction.

Then, as shown in FIG. 1, the buffer layer 20 is provided to relax a difference in lattice constant between the sapphire crystal of the sapphire substrate 10 and the crystal of the nitride semiconductor grown on the sapphire substrate 10. The buffer layer 20 is formed between the sapphire substrate 10 and the semiconductor layer 30. The buffer layer 20 is formed of, for example, AlN. The buffer layer 20 can be formed, for example, by sputtering under predetermined conditions in a buffer layer formation step of the manufacturing method of the nitride semiconductor element 1 as will be mentioned below.

The semiconductor layer 30 constitutes a light emission portion in the nitride semiconductor element 1. As shown in FIG. 1, the semiconductor layer 30 is formed on the sapphire substrate 10 via the buffer layer 20. The semiconductor layer 30 includes a laminated structure of an n-type semiconductor layer 31, an active layer 32, and a p-type semiconductor layer 33 which are stacked on each other from the bottom in this order.

The semiconductor layer 30 includes GaN, AlN, or InN, or a mixed crystal thereof ($In_xAl_yGa_{1-x-y}N$ ($0 \le X$, $0 \le Y$, $X+Y \le 1$)) as a group III-V nitride semiconductor material. In the mixed crystal, a group-III element may be B partially or as a whole, and N as a group-V element may be partially replaced with P, As, or Sb.

According to the nitride semiconductor element 1 of the present embodiment, the sapphire substrate 10 includes the projections 11 on the c-plane thereof. Each of the projections 11 has the circular bottom surface and the upper part in the triangular pyramid shape formed by wet etching. The inclined surface 112a of the upper part is the surface similar to an R-plane (that is, the crystal growth suppression surface) which suppresses the crystal growth. When crystals of the nitride semiconductor are grown on the sapphire substrate 10, the crystal growth of the nitride semiconductor from the inclined surface 112a of the projection 11 can be suppressed. As a result, the nitride semiconductor grown in the lateral direction can be appropriately joined to itself above the projection 11, thereby stably exhibiting the good crystallinity. Note that the term "crystallinity" as used in this embodiment means the dislocation density and the crystal orientation. According to this embodiment, the nitride semiconductor having one or both excellent properties (that is, the low dislocation density and/or the high crystal orientation) can be obtained. The nitride semiconductor element 1 is formed by appropriately joining the grown crystals to itself above the projection 11, thereby improving the light emission efficiency with little dislocation.

[Manufacturing Method of Nitride Semiconductor Element]

A method of manufacturing the nitride semiconductor element 1 according to the one embodiment of the present invention will be described with reference to FIGS. 4 and 5. In the manufacturing method described below, the nitride semiconductor element 1 is a LED.

First, the method of manufacturing a substrate for the nitride semiconductor element will be described. The method of manufacturing the substrate for the nitride semiconductor element includes a masking step shown in FIGS. 4A and 4B, a first etching step shown in FIGS. 4C to 4F, and a second etching step shown in FIGS. 4G and 4H, which are performed in this order. Regarding pairs of FIGS. 4A and 4B, FIGS. 4C and 4D, FIGS. 4E and 4F, and FIGS. 4G and 4H (two figures in each pair are arranged in right and left), each pair includes the cross-sectional view at a left side and the perspective view at a right side illustration the same step. That is, two figures in each pair illustrate the same step from different points of view.

In the masking step, a mask is provided on the sapphire substrate 10. Specifically, in the masking step as show in FIGS. 4A and 4B, for example, a $SiO_2$ film is deposited on the surface at the c-plane side of the flat-plate shaped sapphire substrate 10 with no projections 11 formed thereon, and then patterned to form a plurality of circular masks M.

In the first etching step, the sapphire substrate 10 is etched. Specifically, in the first etching step as shown in FIGS. 4C to 4F, the sapphire substrate 10 with the masks M disposed thereon is dry etched to form a plurality of projections 11 on the surface at the c-plane side of the sapphire substrate 10. Each projection 11 has a bottom surface with a circular shape, and is formed in a conical shape or a dome shape such as a semispherical shape as a whole. When the sapphire substrate 10 is dry etched using material for the mask M that cannot be etched, the cylindrical projection 11 will be formed by the use of a circular mask. In this embodiment, however, the material for the masks M that can be etched is used, and therefore the mask M on the sapphire substrate 10 is also etched in the first etching step. The mask M is gradually etched not only from its upper surface, but also from its side surface, whereby the diameter of the mask M becomes smaller. Thus, the projection 11 on the sapphire substrate 10 is etched in the dome shape such as the semispherical shape, or in the conical shape. A description will be given below of the projection that is dry etched in the conical shape or dome shape.

Specific dry etching methods suitable for use can include, for example, a gas-phase etching, a plasma etching, a reactive ion etching and the like. Examples of an etching gas can include a Cl-based gas such as $Cl_2$, $SiCl_4$ and $BCl_3$; HBr; a F-based gas such as $SF_6$, $CHF_3$, $C_4F_8$ and $CF_4$; and an inert gas such as Ar, and the like.

Figure 4A:
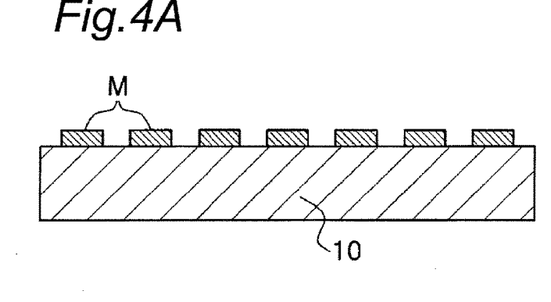
FIG. 4A is a cross-sectional view showing a masking step.
Figure 4B:
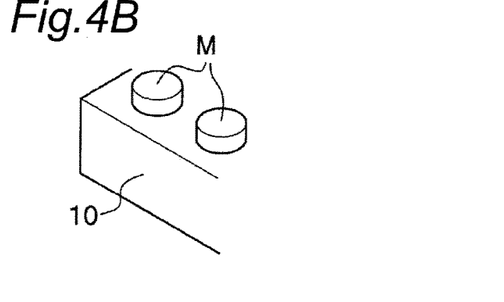
FIG. 4B is a perspective view showing the masking step.
Figure 4C:
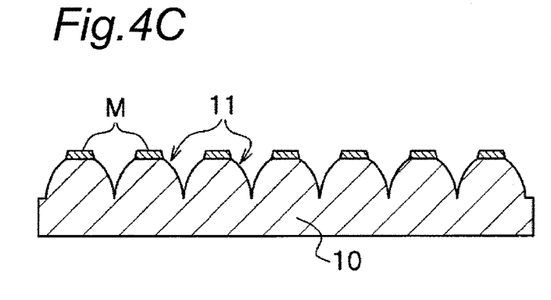
FIG. 4C is a cross-sectional view showing a midstream process in a first etching step.
Figure 4D:
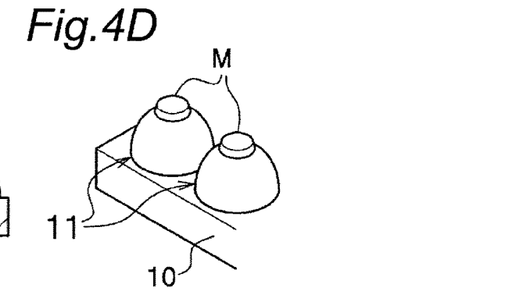
FIG. 4D is a perspective view showing the midstream process in the first etching step.
Figure 4E:
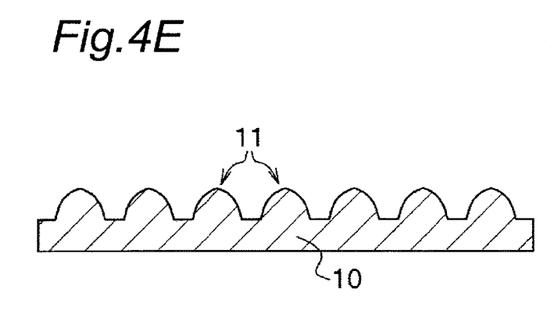
FIG. 4E is a cross-sectional view showing a state of completion of dry etching in the first etching step.
Figure 4F:
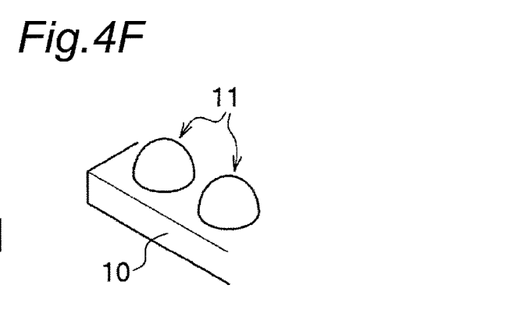
FIG. 4F is a perspective view showing the state of completion of the dry etching in the first etching step.
Figure 4G:
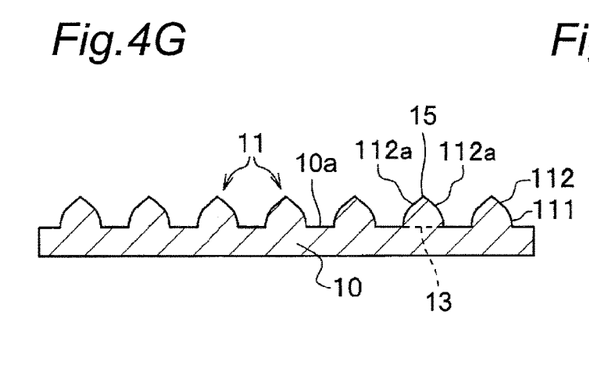
FIG. 4G is a cross-sectional view showing a second etching step.
Figure 4H:
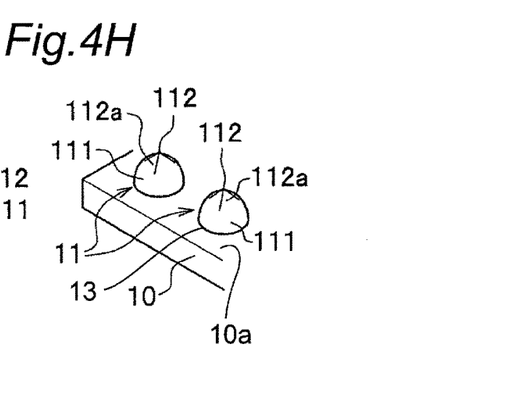
FIG. 4H is a perspective view showing the second etching step.

In the second etching step, the sapphire substrate 10 is further etched after the first etching step. Specifically, as shown in FIGS. 4G and 4H, the second etching step involves wet etching the sapphire substrate 10 on which the projections 11 with the conical shape or the dome shape such as the semispherical shape, are formed in the first etching step. Thus, an upper part of each projection 11 having the conical shape or the dome shape such as the semispherical shape is formed into a triangular pyramid shape while keeping the bottom surface of the projection 11 circular.

Note that when the projections 11 of the sapphire substrate 10 is shaped in the cylindrical shape or the truncated cone shape in the first etching step, an upper surface thereof (the c-plane) still remains at the end of the first etching step. The upper surface of the projections 11 is etched in the second etching step into the triangular pyramid shape. When the upper surface of the projections 11 is remained at the end of the first etching step, the second etching step is performed enough to disappear the upper surface (the c plane), which may increase an etching time in the second etching step. If the etching time is too long, the circular bottom surface may be etched into the triangular shape. Therefore, the upper surface of the projections 11 is preferably small, and more preferably does not exist, at the end of the first etching step.

In the second etching step, the wet etching progresses from a tip end of the projection 11 in the conical shape or the dome shape such as the semispherical shape during the wet etching process, and the upper part of the projection 11 is etched into a triangular pyramid shape. Typically, when the sapphire crystal SC is wet etched, the surface close to the R plane is more likely to be exposed. As shown in FIG. 4H, the upper projecting portion 112 of the projection 11 is formed in the triangular pyramid shape consisted of the inclined surface 112a similar to the R plane of the sapphire crystal SC through the second etching step.

Suitable etchants for the wet etching can include, for example, a phosphoric acid, a pyrophosphoric acid, or a mixed acid produced by adding sulfuric acid to these acid, or potassium hydroxide. Conditions for the wet etching are preferably as follows: a temperature of the etchant of 150° C. to 300° C., and an immersion time of 1 minute to 60 minutes. The conditions of the wet etching in the second etching step are determined so that the inclined surface 112a is exposed within a desired range.

Next, the method of manufacturing the nitride semiconductor element 1 will be described. The manufacturing method of the nitride semiconductor element 1 includes, a substrate preparing step in which the substrate for the nitride semiconductor element is prepared by the manufacturing method as mentioned above (see FIGS. 4A to 4H), a buffer layer formation step shown in FIG. 5A, and a semiconductor layer growth step shown in FIG. 5B, which are performed in this order. In the manufacturing method of the nitride semiconductor element 1, the substrate preparation step can be replaced with another step for preparing the substrate (that is, another substrate preparation step) in which the sapphire substrate 10 with the projections 11 as shown in FIGS. 4G and 4H is previously prepared by another manufacturing method of the substrate rather the above-mentioned manufacturing method (see FIGS. 4A to 4H). After the other substrate preparation step, the buffer layer formation step shown in FIG. 5A and the semiconductor layer growth step shown in FIG. 5B are performed in this order to manufacture the nitride semiconductor element 1.

Figure 5A:
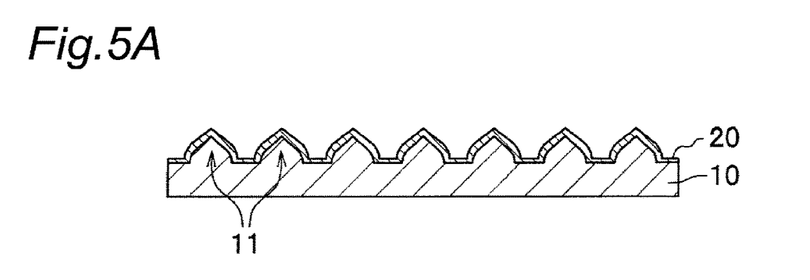
FIG. 5A is a cross-sectional view showing a buffer layer formation step.

In the buffer layer formation step, the buffer layer 20 is formed on the sapphire substrate 10. Specifically, in the buffer layer formation step, as shown in FIG. 5A, the buffer layer 20 is deposited on the surface of the sapphire substrate 10 with the projections 11 formed thereon, for example, by sputtering.

In the semiconductor layer growth step, the semiconductor layer 30 is grown on the surface of the sapphire substrate 10 with the projections 11 formed thereon to form a light emitting element structure. Specifically, in the semiconductor layer growth step, as shown in FIG. 5B, crystals of the n-type semiconductor layer 31 are grown on the c-plane side surface of the sapphire substrate 10 on which the projections 11 formed, via the buffer layer 20. Subsequently, the active layer 32 is grown on the n-type semiconductor layer 31, and then the p-type semiconductor layer 33 is grown thereon. In this way, the light emitting element structure including the active layer 32 is formed. In the n-type semiconductor layer 31, the undoped nitride semiconductor layer is grown without intentionally adding impurities until the nitride semiconductor is joined to itself above the projection 11. Thereafter, n-type impurities may be added to the nitride semiconductor to grow an n-type nitride semiconductor. The semiconductor layer 30 joined to itself above the projection 11 is preferably GaN. Instead of the light emitting element structure, another element structure such as a field-effect transistor can also be formed on the substrate 10 with the projection 11.

Figure 5B:
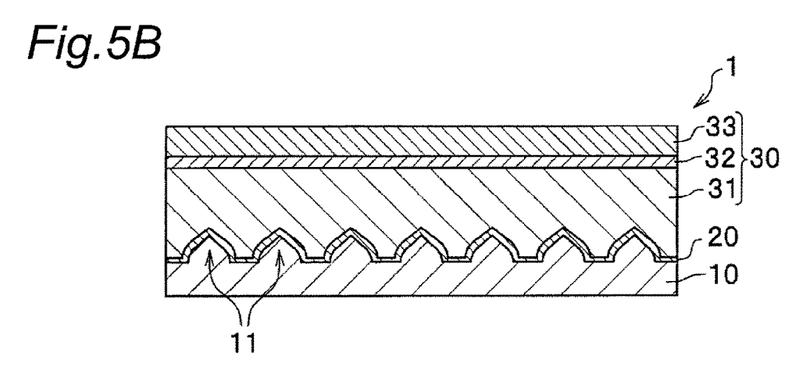
FIG. 5B is a cross-sectional view showing a semiconductor layer growth step.
Figure 5C:
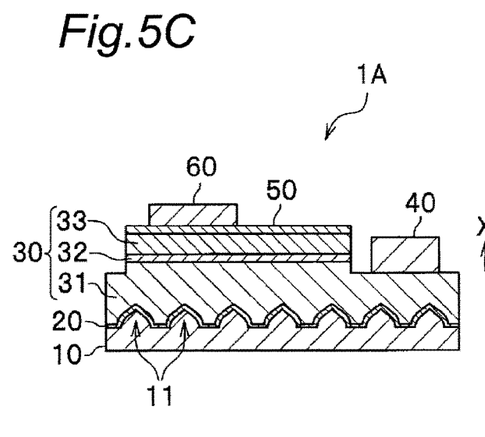
FIG. 5C is a cross-sectional view showing an example of the nitride semiconductor element with electrodes formed after the semiconductor layer growth step, specifically, illustrating the cross-sectional view taken along the line X-X in FIG. 5D.
Figure 5D:
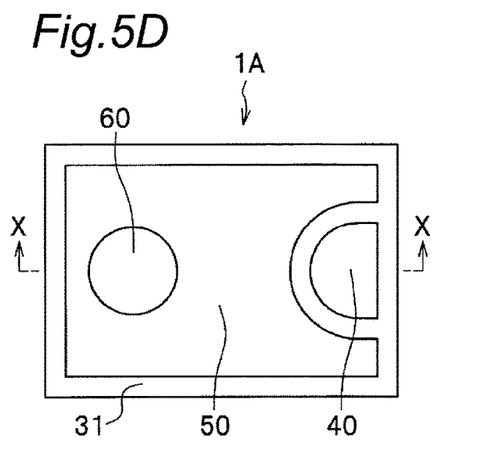
FIG. 5D is a plan view showing an example of the nitride semiconductor element with electrodes formed after the semiconductor layer growth step.

Through the steps mentioned above, the nitride semiconductor element 1 can be manufactured as shown in FIG. 5B. Then, a specific example in which the nitride semiconductor element 1 is a semiconductor light emitting element (LED chip) is illustrated in FIGS. 5C and 5D. The nitride semiconductor element 1A shown in FIGS. 5C and 5D includes the sapphire substrate 10 with the projections 11, the n-type semiconductor layer 31, the active layer 32, and the p-type semiconductor layer 33 which are formed over the substrate. The n-type semiconductor layer 31 is partially exposed and an n-electrode 40 is provided on an exposed portion thereof. A transparent electrode 50 and a p-electrode 60 are provided on the surface of the p-type semiconductor layer 33. These electrodes can be formed in an electrode formation step after the semiconductor layer growth step. In the electrode formation step, first, parts of the p-type semiconductor layer 33 and the active layer 32 are removed by dry etching and the like to expose a part of the n-type semiconductor layer 31. Then, the n-electrode 40 is formed on the exposed portion of n-type semiconductor layer 31, the transparent electrode 50 is formed on the p-type semiconductor layer 33, and the p-electrode 60 is formed on the transparent electrode 50. As a result, a nitride semiconductor element 1A shown in FIGS. 5C and 5D can be manufactured. Note that the manufacturing method may include a dicing step which involves dicing the light emitting element structure and the sapphire substrate 10 to divide them into individual elements after the semiconductor layer growth step. At this time, the electrode formation step is performed after the semiconductor layer growth step and before the dicing step.

In this way, according to the method of manufacturing the nitride semiconductor element 1, the semiconductor layer is grown using the sapphire substrate 10 having the projections 11 at the c-plane side surface thereof, each projection 11 having the circular bottom surface, and the upper projecting portion 112 in the triangular pyramid-shape constructed by the inclined surface similar to the R-plane being able to suppress the crystal growth. Therefore, the crystal growth of the nitride semiconductor from the surface of the projection 11 can be suppressed when crystals of the nitride semiconductor are grown on the sapphire substrate 10. As a result, there is substantially no abnormal grown nitride semiconductor on the surface of the protrusion 11. When the nitride semiconductor grown from the flat surface (the crystal growth surface 10a) of the sapphire substrate 10 is grown in the lateral direction to cover the projection 11, it suppresses to inhibit the crystal growth of the nitride semiconductor by the abnormal grown nitride semiconductor. Accordingly, the nitride semiconductor grown from the flat surface (the crystal growth surface 10a) is more likely to be appropriately joined to itself above the projection 11, thereby stably exhibiting the good crystallinity.

Figure 6A:
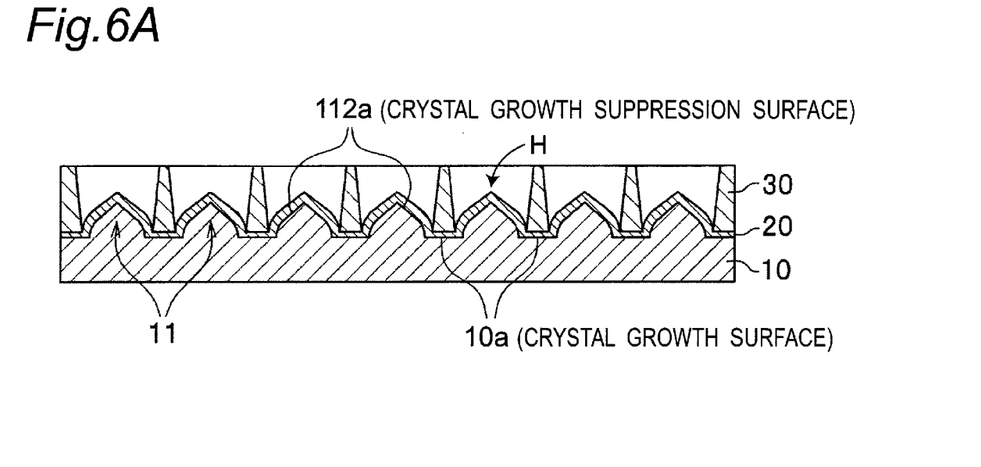
FIG. 6A is a cross-sectional view showing the nitride semiconductor in the process of growing in the semiconductor layer growth step of the manufacturing method of the nitride semiconductor element.
Figure 6B:
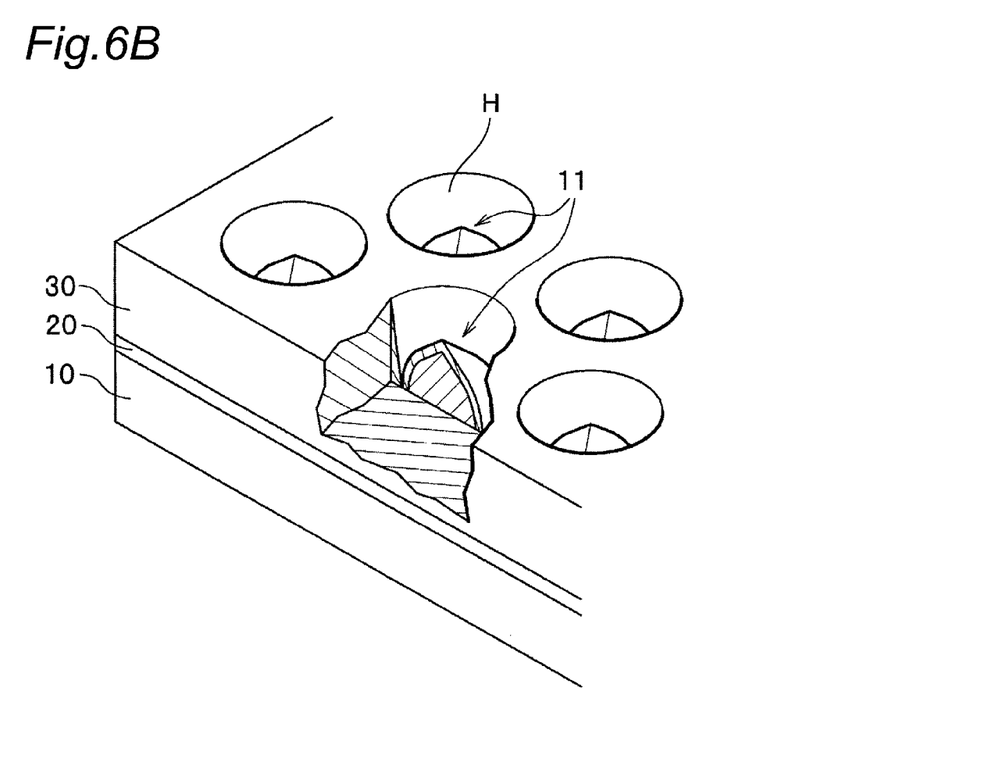
FIG. 6B is a partly sectional fragmentary perspective view of the nitride semiconductor in the process of growing in the semiconductor layer growth step of the manufacturing method of the nitride semiconductor element.
Figure 7A:
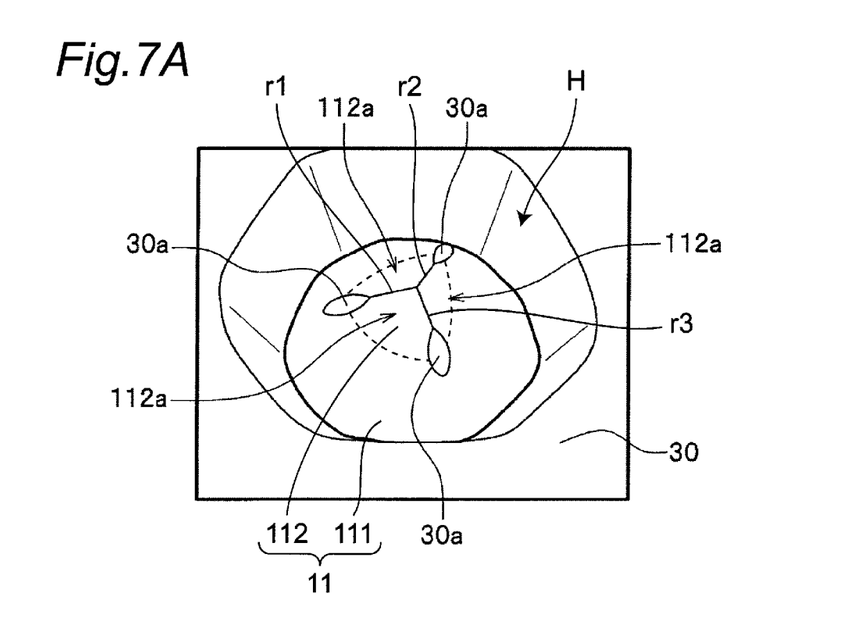
FIG. 7A is a perspective view showing the projections and the nitride semiconductor in the process of growing in the semiconductor layer growth step of the manufacturing method of the nitride semiconductor element.
Figure 7B:
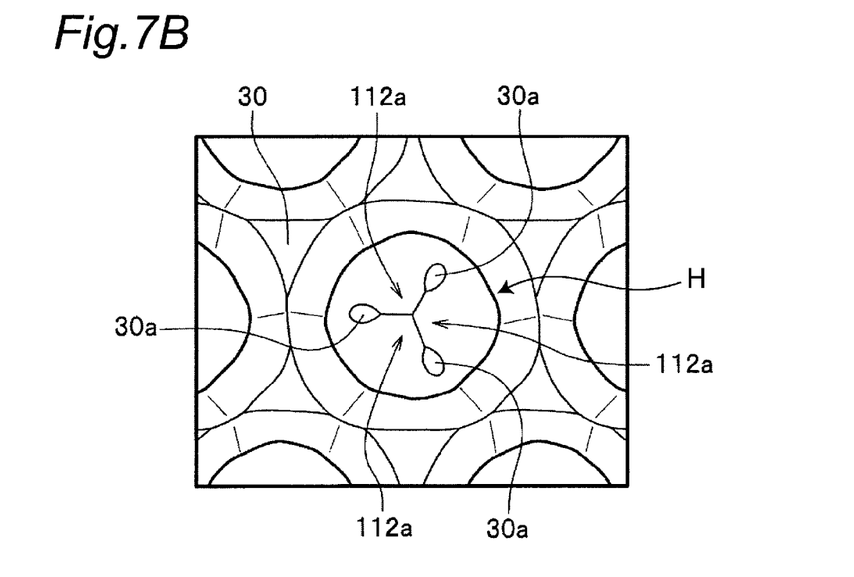
FIG. 7B is a plan view showing the projections and the nitride semiconductor in the process of growing in the semiconductor layer growth step of the manufacturing method of the nitride semiconductor element.

In order to confirm the effects of the sapphire substrate 10 according to the embodiment of the present invention in more detail, the relationship between the projection 11 and the crystal growth of the nitride semiconductor on the sapphire substrate 10 will be described below with reference to FIGS. 6 and 7. FIGS. 6 and 7 illustrate the nitride semiconductor in the process of growing in the semiconductor layer growth step of the manufacturing method of the nitride semiconductor element 1.

Referring to FIGS. 6A and 6B, when crystals of the nitride semiconductor are grown via the buffer layer 20 on the sapphire substrate 10 with the projections 11 formed thereon, crystals are grown not from the buffer layer 20 formed on the surface of the projection 11, but from the buffer layer formed over the crystal growth surface 10a between the projections 11. This is because the surface of the projection 11 is sufficiently inclined to the c-plane of the sapphire substrate, whereby even in the presence of the buffer layer, a lattice constant of the crystal of the nitride semiconductor matches worse with that of the surface of the projection 11 than that of the crystal growth surface 10a. The nitride semiconductor has the hole H extending upward from the projection 11. As mentioned above, the inclined surface 112a of the upper projecting portion 112 of the projection 11 (the crystal growth suppression surface) is the surface similar to the R-plane of the sapphire crystal SC, and the crystal growth surface 10a is the c-plane of the sapphire crystal SC (see FIG. 2).

More specifically, as shown in FIGS. 7A and 7B, the nitride semiconductor 30a is slightly grown in a vicinity of a boundary between the ridge lines r1, r2, and r3 of the upper projecting portion 112 and a dome-shaped side surface of the lower projecting portion 111 in the surface of the projection 11, but the nitride semiconductor is hardly grown at surfaces of the projections 11 other than the vicinity of the boundary. Thus, the nitride semiconductor grown vertically from the crystal growth surface (the flat surface) other than the projection 11 is provided with the hole H shown in FIGS. 7A and 7B. As can be seen from FIG. 7A, the hole H has a shape similar to an inverted hexagonal pyramid shape expanding upward. Since the nitride semiconductor is grown in three dimensions (that is, grown vertically and laterally), the nitride semiconductor is progressively grown toward the center of the hole H when the crystal growth of the nitride semiconductor progresses. After the nitride semiconductor is sufficiently grown in the lateral direction, the holes H are fully filled with the grown nitride semiconductor, and the projections 11 are covered with the nitride semiconductor, thereby forming the semiconductor layer 30 with no hole shown in FIG. 1.

The projection 11 provided on the sapphire substrate 10 in this way has the circular bottom surface 13, and the upper projecting portion 112 of the projection 11 formed in the triangular pyramid shape, thereby improving the crystallinity of the nitride semiconductor formed on the sapphire substrate 10.

As mentioned above, the height of the upper projecting portion 112 is preferably 10% or more of the overall height of the projection 11, more preferably 20% or more, and for example, 50% or more. Further, in order to keep the shape of the bottom surface of the projection 11 circular, the height of the upper projecting portion 112 in the overall height of the projection 11 is preferably 80% or less. The range in which the upper projecting portion 112 is formed can be adjusted by adjusting the temperature and the immersion time of the wet etching in the etching step. Moreover, the range of the upper projecting portion 112 can also be adjusted by adjustment of the type and concentration of the etchant for wet etching.

The nitride semiconductor element and the manufacturing method thereof according to the present invention have been specifically described by way of the embodiments of the present invention, but the scope of the present invention is not limited to the above description. It is to be understood that the scope of the present invention must be widely interpreted based on the description of claims. It is obvious that based on the above description, various modifications and changes can be made to these embodiments within the scope and spirit of the present invention.

DESCRIPTION OF REFERENCE NUMERALS 1, 1A: Nitride semiconductor element
10: Sapphire substrate (substrate for nitride semiconductor element)
10a: Upper surface of substrate (crystal growth surface)
11: Projection
111: Lower projecting portion
112: Upper projecting portion
112a: Inclined surface (crystal growth suppression surface)
20: Buffer layer
30: Semiconductor layer
30a: Nitride semiconductor
31: n-type semiconductor layer
32: Active layer
33: p-type semiconductor layer
40: n-electrode
50: Transparent electrode
60: p-electrode M: Mask
SC: Sapphire crystal

What is claimed is:

1. A nitride semiconductor element comprising:
   a sapphire substrate comprising a plurality of projections disposed on a surface thereof at a c-plane side; and
   a semiconductor layer made of a nitride semiconductor and disposed on the surface of the sapphire substrate,
   wherein each projection comprises a circular bottom periphery, and an upper part that has a triangular pyramid shape, and
   wherein respective centers of the projections are positioned at lattice points of a triangular lattice.

2. The nitride semiconductor element according to claim 1, wherein each projection further comprises a lower part, the upper part being formed continuously with the lower part.

3. The nitride semiconductor element according to claim 1, wherein a distance between adjacent projections is in a range of 0.2 µm to 5 µm.

4. The nitride semiconductor element according to claim 1, wherein a width of each projection is in a range of 0.2 µm to 5 µm.

5. The nitride semiconductor element according to claim 1, wherein a height of each projection is in a range of 0.2 µm to 2 µm.

6. The nitride semiconductor element according to claim 1, wherein a height of the upper part of each projection is 10% or more of an overall height of that projection.

7. The nitride semiconductor element according to claim 1, wherein an angle of an inclined surface of the upper part of each projection with respect to said surface of the sapphire substrate is 33° to 37°.

8. A method of manufacturing a nitride semiconductor element, the method comprising:
   dry etching a main surface of a sapphire substrate at a c-plane side thereof, with a mask provided on the main surface, thus forming a plurality of projections, wherein each projection comprises a circular bottom periphery, and wherein respective centers of the projections are positioned at lattice points of a triangular lattice;
   wet etching the sapphire substrate, thus forming an upper part of each projection into a triangular pyramid shape while maintaining the circular bottom periphery of each projection; and
   growing a semiconductor layer made of a nitride semiconductor on the sapphire substrate after said dry etching and wet etching.

9. The method according to claim 8, wherein each projection further comprises a lower part, the upper part being formed continuously with the lower part.

10. The method according to claim 8, wherein a distance between adjacent projections is in a range of 0.2 µm to 5 µm.

11. The method according to claim 8, wherein a width of each projection is in a range of 0.2 µm to 5 µm.

12. The method according to claim 8, wherein a height of each projection is in a range of 0.2 µm to 2 µm.

13. The method according to claim 8, wherein a height of the upper part of each projection is 10% or more of an overall height of that projection.

14. The method according to claim 8, further comprising:
   forming a buffer layer on the surface of the sapphire substrate after said wet etching the sapphire substrate and before growing the semiconductor layer.

* * * * *